United States Patent [19]
Redford

[11] Patent Number: 6,121,905
[45] Date of Patent: Sep. 19, 2000

[54] METHOD AND APPARATUS FOR DECODING JPEG SYMBOLS

[75] Inventor: John Redford, Cambridge, Mass.

[73] Assignee: Oak Technology, Inc., Sunnyvale, Calif.

[21] Appl. No.: 09/075,580

[22] Filed: May 11, 1998

[51] Int. Cl.[7] .................................................. H03M 7/40
[52] U.S. Cl. ............................................. 341/67; 341/65
[58] Field of Search ......................................... 341/67, 65

[56] References Cited

U.S. PATENT DOCUMENTS

| | | | |
|---|---|---|---|
| 3,717,851 | 2/1973 | Cocke et al. | |
| 5,055,841 | 10/1991 | Cordell | 341/67 |
| 5,181,031 | 1/1993 | Tong et al. | 341/65 |
| 5,208,593 | 5/1993 | Tong et al. | 341/65 |
| 5,245,338 | 9/1993 | Sun et al. | 341/67 |
| 5,254,991 | 10/1993 | Ruetz et al. | 341/65 |
| 5,325,092 | 6/1994 | Allen et al. | |
| 5,825,312 | 10/1998 | D'Ortenzio | 341/65 |

FOREIGN PATENT DOCUMENTS

| | | |
|---|---|---|
| 0589 682 | 3/1994 | European Pat. Off. |
| 0665 653 | 8/1995 | European Pat. Off. |

OTHER PUBLICATIONS

Patent Cooperation Treaty, International Search Report, International Application No. PCT/US99/10170, mailed on Dec. 21, 1999, 6 pages.

*Primary Examiner*—Howard L. Williams
*Attorney, Agent, or Firm*—Testa, Hurwitz & Thibeault, LLP

[57] ABSTRACT

A method and apparatus for decoding JPEG Huffman symbols is described. A content addressable memory module stores bit patterns representing Huffman symbols that must be decoded in a single decoding cycle. A compare-add module stores bit patterns representing Huffman symbols that can be decoded in following cycles. The content addressable memory module and the compare-add module each compare a Huffman symbol with their stored bit patterns and generate a corresponding bit pattern when a match is found. The method takes advantage of the high speed possible with a content addressable memory and the small size of the compare-add module.

15 Claims, 4 Drawing Sheets

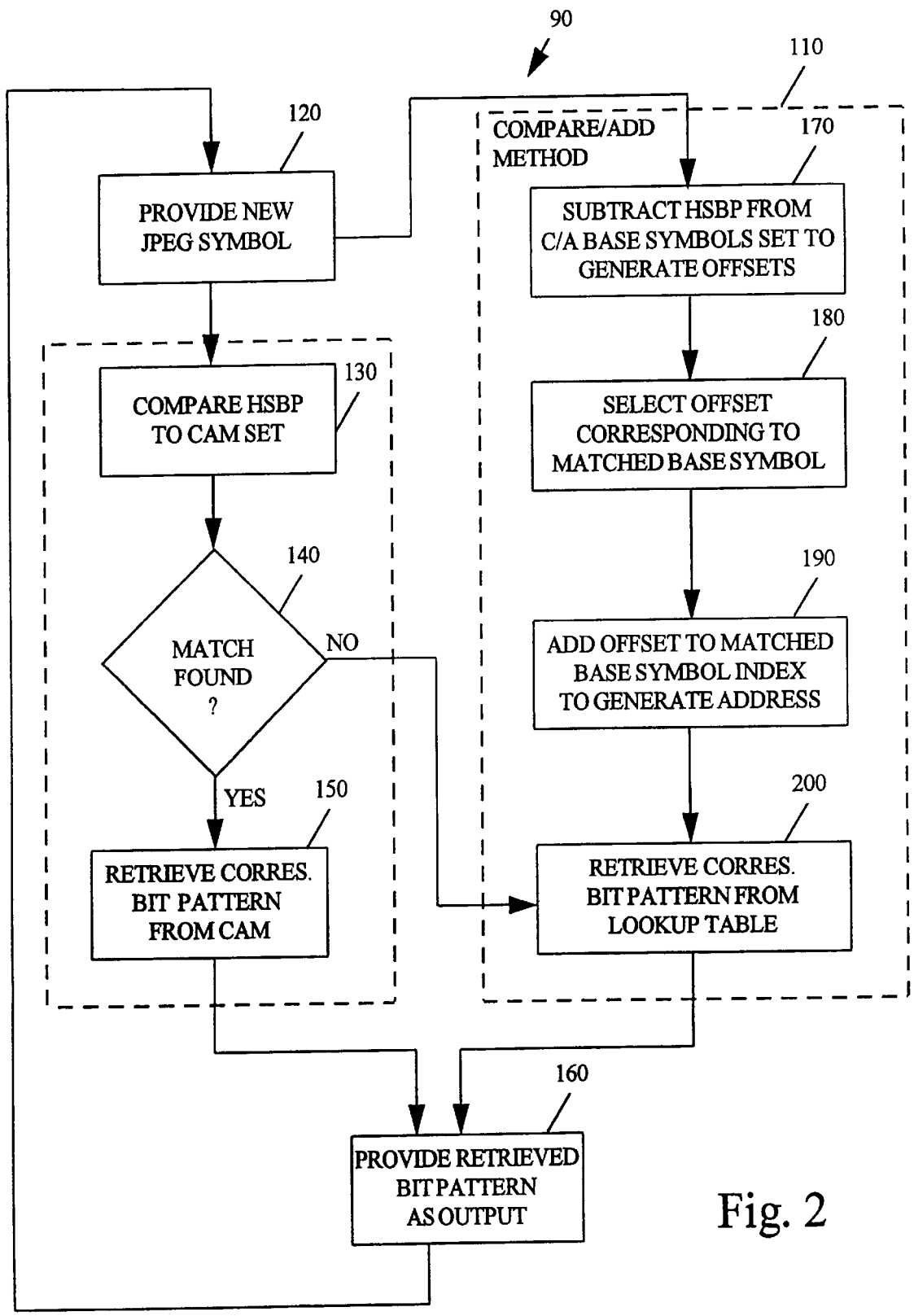

METHOD AND APPARATUS FOR DECODING JPEG SYMBOLS

FIELD OF THE INVENTION

The invention relates generally to a method and apparatus for decoding image data. In particular, the invention relates to a method for decoding JPEG symbols utilizing both a content-addressable memory and a compare-add module.

BACKGROUND OF THE INVENTION

Image compression techniques reduce the memory required for storage of large or complex images, permitting storage of images in devices with limited memory. For example, image compression techniques used in digital copiers and scanners assist in storage of complex images for subsequent printing. Similarly, image compression benefits communications where bandwidth limitations would otherwise render transmission of image data impractical. Image compression also offers substantial benefits for archiving large image libraries.

The JPEG (Joint Photographic Experts Group) standard is a set of image compression techniques that have gained widespread acceptance. The most popular of the three general compression methods defined by the JPEG standard is the baseline sequential discrete cosine transform (DCT) technique. This technique reduces the file size of grayscale and color images with a near minimum possible loss of image quality. The basic image unit for JPEG compression is the block which includes an eight pixel by eight pixel subset of the image. Each image block is analyzed and quantized, yielding DCT coefficients representative of the image block content. The coefficients are then Huffman coded to reduce the amount of data used to characterize them.

Huffman coding generally includes combining a zero run length and a magnitude length to represent the coefficients in the smallest possible number of bits. The zero run length describes the number of consecutive zero-valued coefficients preceding a non-zero coefficient. The magnitude length specifies the size (i.e., number of bits) and sign of the non-zero coefficient. The Huffman codes are based on a set of variable word length symbols. The number of bits used to represent a particular Huffman code is inversely related to the probability of encountering the run-length/magnitude length represented by that code (i.e., entropy encoding).

JPEG Huffman symbols are typically decoded by comparing a symbol to a set of stored symbols according to a "compare-add" method. If a match is found, the stored symbol is subtracted from the symbol to be decoded and the difference is added to the corresponding table offset to yield a sum. The sum is then used to address a table that holds the value of the symbol. The compare-add method can sometimes be too slow for some applications because it requires performing a large number of sequential operations.

JPEG Huffman symbols can also be decoded by comparing the symbol bit pattern to a set of stored bit patterns according to a "content-addressable-memory" (CAM) method. If a match is found, the value for that symbol is read out. The CAM method is generally faster than the compare-add method, but it requires storage for a large number of bit patterns.

SUMMARY OF THE INVENTION

In one aspect, the present invention features a method for decoding JPEG symbols. The method combines aspects of a compare-add method and a CAM method to achieve an improved decompression rate. The method is particularly useful in applications that require certain Huffman symbols to be decoded faster than others. Bit patterns representing symbols to be decoded in one decode cycle are stored in a CAM. Bit patterns representing symbols to be decoded in multiple cycles are decoded with a compare-add module. The method thus benefits from the high speed of the CAM method when necessary and uses the storage-efficient compare-add method otherwise.

The decoding method includes the step of comparing a Huffman symbol bit pattern to a set of stored bit patterns in a CAM and retrieving a first bit pattern if the Huffman symbol bit pattern matches one of the stored bit patterns. The method also includes a compare-add step in which a Huffman symbol bit pattern is compared to each bit pattern in a set of symbol bit patterns. Each base symbol value uniquely corresponds to the base symbol bit pattern, which corresponds to the Huffman symbol bit pattern length. The Huffman symbol bit pattern is subtracted from each stored symbol bit pattern to create a set of offset values. The offset value corresponding to the base symbol bit pattern which is matched to the Huffman symbol bit pattern is selected and added to a base symbol value to generate an offset address. In one embodiment, this selection includes choosing the smallest non-negative offset value. A second bit pattern is retrieved from a lookup table based on the offset address. The lookup table can be stored in a random access memory (RAM). The second bit pattern can contain the symbol length and a zero run length corresponding to the matched bit pattern. If the Huffman symbol bit pattern matches one of the bit patterns stored in the CAM, then the first bit pattern is provided as output. If, however, the Huffman symbol is not matched with any of the bit patterns stored in the CAM, then the second bit pattern is provided as output.

In one embodiment, the set of stored bit patterns in the content-addressable memory represent single coefficient Huffman symbols and the set of stored base symbol bit patterns represent multiple coefficient Huffman symbols. In another embodiment, the CAM and compare-add steps described above can include multiple sets of bit patterns for comparison with the Huffman symbol bit pattern. Each of these sets of bit patterns can represent a different Huffman symbol table.

In another aspect, the invention features an apparatus for decoding JPEG symbols. The apparatus includes a Huffman symbol register, a CAM module, a compare-add module and a symbol shifter. The Huffman symbol receives, stores and outputs a Huffman symbol to be decoded. The CAM module and the compare-add module receive the Huffman symbol from the Huffman symbol register and each generates a symbol length and a magnitude length. The symbol shifter receives the symbol length from the CAM module or the compare-add module and provides a subsequent symbol to the Huffman symbol register.

In one embodiment, the CAM compares the bit pattern of the Huffman symbol with a set of stored bit patterns to determine the symbol length and the magnitude length. In another embodiment, the compare-add module includes a comparator module, a lookup address register and a RAM. The comparator module compares the bit pattern of the Huffman symbol with a set of stored base symbol bit patterns to generate a lookup address which is provided to the lookup address register for storage. The RAM stores a symbol length and a magnitude length for a set of addresses and provides the symbol length and magnitude length corresponding to the lookup address in the lookup address register.

BRIEF DESCRIPTION OF THE DRAWINGS

The foregoing and other objects, features and advantages of the invention will become apparent from the following more particular description of preferred embodiments of the invention, as illustrated in the accompanying drawings. The drawings are not necessarily to scale, emphasis instead being placed on illustrating the principles of the present invention.

FIG. 2 is a flow chart of the method for decoding a Huffman symbol using the CAM/compare-add method of the present invention.

DETAILED DESCRIPTION OF THE INVENTION

Figure 1A:
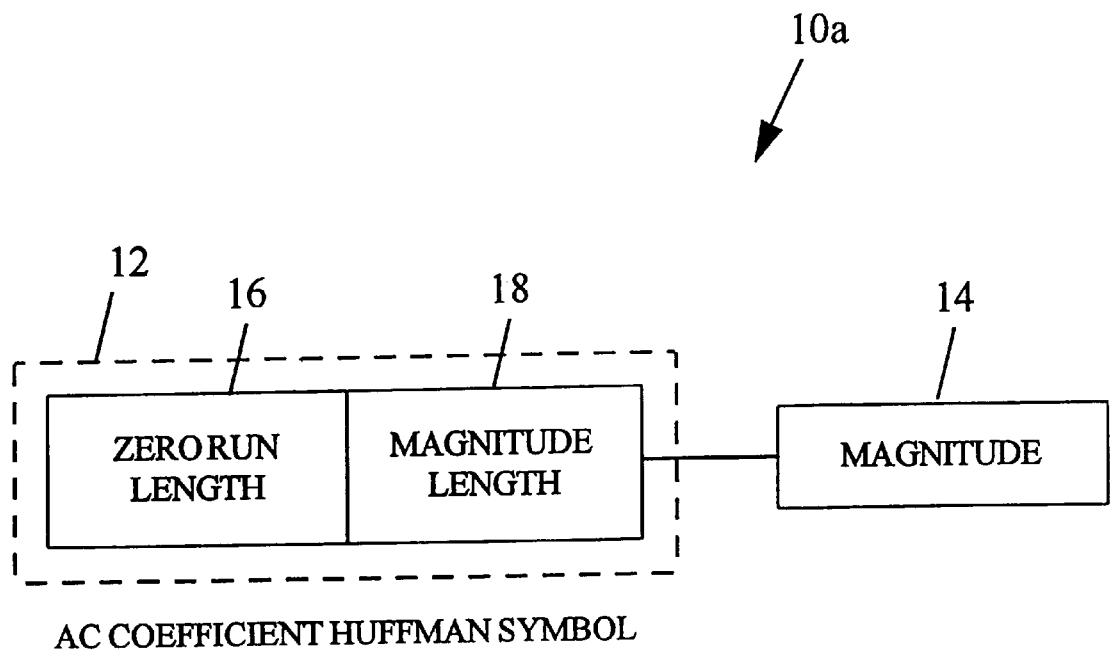
FIGS. 1A and 1B are diagrams of JPEG symbols having an AC coefficient Huffman symbol and a DC coefficient Huffman symbol, respectively.
Figure 1B:
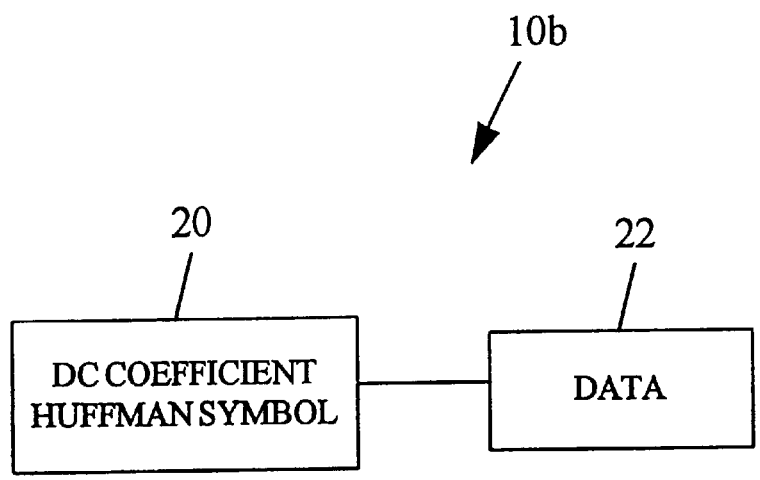

Referring to FIG. 1A, a JPEG symbol 10*a* with AC magnitude information includes an AC coefficient Huffman symbol 12 and a magnitude portion 14. The Huffman symbol 12 can be between one and sixteen bits long while the magnitude portion 14 can be between zero and ten bits long. The AC coefficient Huffman symbol 12 includes a zero-run-length portion 16 and a magnitude length portion 18 which describes the number of bits in the magnitude portion 14. FIG. 1B illustrates a JPEG symbol 10*b* with DC magnitude information. The DC coefficient is always the first coefficient encountered for each 8×8 pixel block, thus the DC coefficient Huffman symbol 20 contains no zero-run-length information. Instead, the DC coefficient Huffman symbol 20 describes the number of bits in the data portion 22 which can be between zero and eleven bits long.

The present invention relates to decoding the Huffman symbol portion 12,20 of the JPEG symbol 10*a*, 10*b* by using a combination of a CAM method 100 and a compare-add method 110 as illustrated in the flow chart of FIG. 2. In step 120, a JPEG symbol to be decoded is provided. In step 130, the Huffman symbol bit pattern in the JPEG symbol is compared with a set of stored symbols that are decoded in a single decoding cycle (i.e., single coefficient Huffman symbols). In step 140, if a match is found between the Huffman symbol bit pattern and one of the set of stored symbols in the CAM, then a corresponding bit pattern is retrieved from the CAM in step 150 and provided as an output in step 160.

In step 170, the Huffman symbol bit pattern portion of the JPEG symbol provided in step 120 is subtracted from each of a set of stored base symbols. Each stored base symbol corresponds to a multiple coefficient Huffman symbol. The result of the subtractions is a set of offsets (i.e., difference values). In step 180, the offset corresponding to the matched base symbol is selected. In one embodiment, the selected offset is the smallest non-negative offset value. In step 190, the selected offset is added to one of a set table indices to generate an address to a lookup table that holds the value of the symbol. The lookup table can be stored in RAM. In step 200, a bit pattern corresponding to the address is retrieved from the lookup table and, in step 160, provided as output. The retrieved bit pattern can yield the overall symbol length and the zero run length of the JPEG symbol.

Steps 130 and 170 can be performed in parallel. Since the compare-add method 110 has to perform a large number of sequential operations, the sequence of CAM steps 100 (130, 140 and 150) is generally completed faster than the sequence of compare-add steps 110 (170, 180, 190 and 200). Thus, if there is a match according to CAM step 140, the corresponding bit pattern is provided as output in step 160 and there is no need to complete the sequence of compare-add steps 110. However, if no match is found in step 140, then completion of all compare-add steps 110 occurs and the corresponding bit pattern is provided as output in step 160.

The method 90 combines the advantages of a CAM method 100 and a compare-add method 110. The method 90 achieves the high speed of the CAM method 90, when necessary, and provides the small size advantage of the compare-add method 110.

Figure 3:
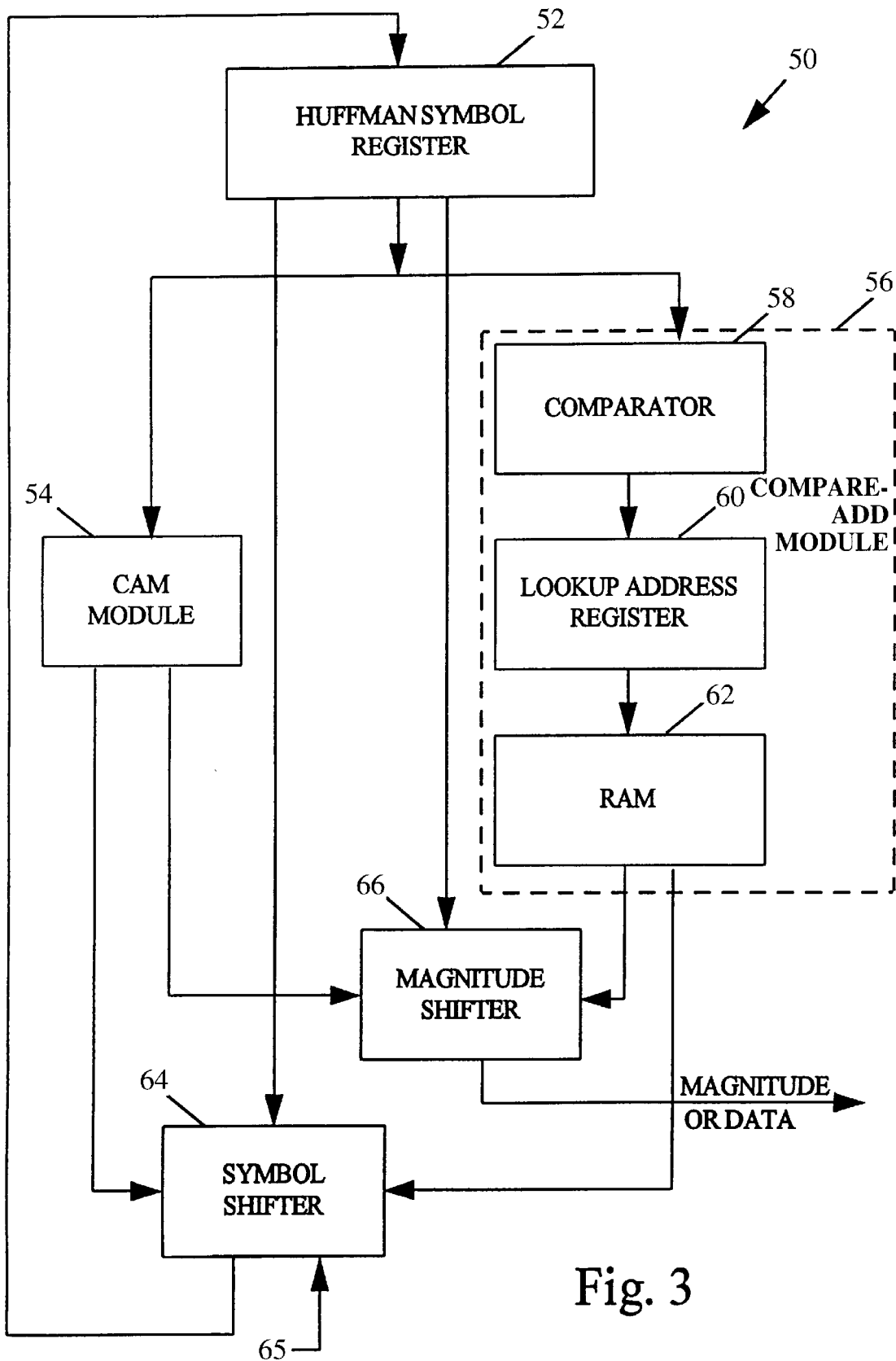
FIG. 3 is a block diagram of an apparatus for decoding a Huffman symbol in accordance with the present invention.

Referring to FIG. 3, a block diagram of a decoder 50 of the present invention is shown. A Huffman symbol register 52 temporarily stores symbols and provides them to a CAM module 54 and a compare-add module 56. Both the CAM module 54 and the compare-add module 56 can store multiple sets of bit patterns. Each set of bit patterns can represent a different Huffman symbol table. The CAM module 54 preferably stores only those bit patterns which correspond to symbols that need to be decoded in a single decoding cycle. The stored CAM bit patterns are compared with the symbol from the symbol register 52 and, if a match is found on the Huffman symbol portion 12,20, the CAM module 54 generates a symbol shift value which is received by a symbol shifter 64. The symbol shifter 64 shifts over the current symbol in order to access the next symbol and shift in new symbols 65. A magnitude shift value is also generated and provided to a magnitude shifter 66. The Huffman symbol portion 12,20 is shifted by the magnitude shifter 66 in order to access the magnitude portion 14 or data portion 22 which are provided for further processing.

The compare-add module 56 processes symbols in parallel with the CAM module 54. The compare-add module 56 includes a comparator 58, a lookup address register 60, and a random access memory 62. The comparator 56 receives the current symbol from the Huffman symbol register 52 and compares it with a set of base symbols. In one embodiment, the set of base symbols contains sixteen symbols. The comparison requires one full decoding cycle to complete, so the result of the comparison is stored in a lookup address register 60 and can be used on the following decoding cycle to retrieve the corresponding bit pattern from the RAM 62. If the CAM module 54 does not find a match during the first decoding cycle, the magnitude 14 is set to zero and the symbol shifter 64 and magnitude shifter 66 receive shift values from the RAM 62 during the following decoding cycle.

Figure 4:
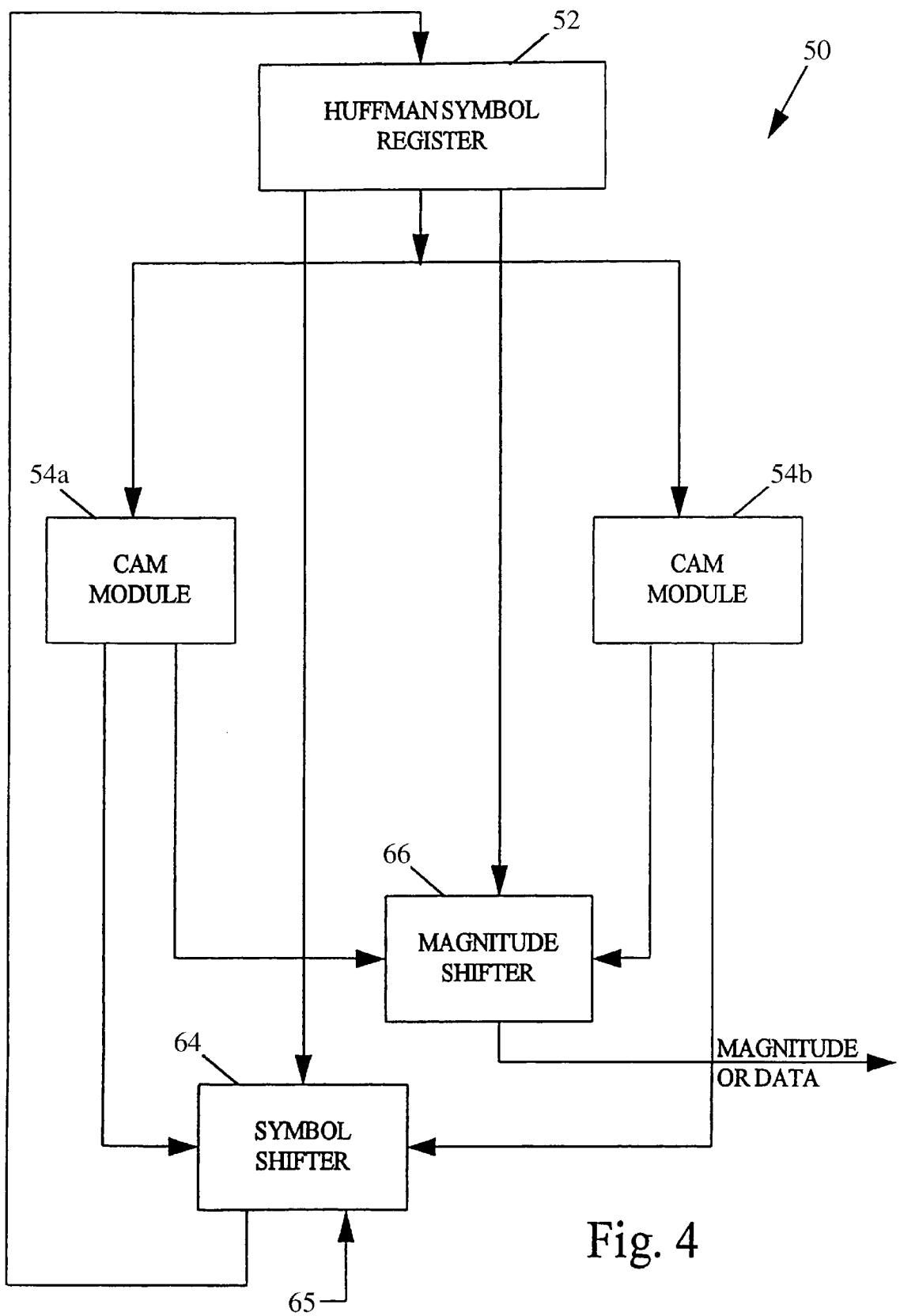
FIG. 4 is a block diagram of an apparatus having two CAMs for decoding a Huffman symbol in accordance with the present invention.

Referring to FIG. 4, another embodiment of a decoder 50 according to the present invention includes a second CAM module 54*b* to replace the compare-add module 56 of FIG. 3. The CAM modules 54*a*, 54*b* receive the current symbol from the Huffman symbol register 52 and compare it with a set of stored bit patterns. One CAM module 54 stores bit patterns representing symbols that must be decoded during a single decoding cycle. The second CAM module 54' stores a larger number of bit patterns, each of which need not be decoded during a single decoding cycle.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method for decoding a JPEG symbol comprising the steps of:
   comparing a Huffman symbol bit pattern to a set of stored bit patterns in a content-addressable memory;
   comparing the Huffman symbol bit pattern to a set of base symbol bit patterns in a compare-add module;
   providing as an output signal a first bit pattern from the content-addressable memory if the Huffman symbol bit pattern matches one of the set of stored bit patterns in the content-addressable memory; and
   providing as an output signal a second bit pattern from the compare-add module if the Huffman symbol bit pattern matches one of the base symbol bit patterns in the compare-add module.

2. The method of claim 1 wherein the step of comparing the Huffman symbol bit pattern to a set of stored bit patterns in an content-addressable memory and the step of comparing the Huffman symbol bit pattern to a set of base symbol bit patterns in a compare-add module are performed concurrently.

3. A method for decoding a JPEG symbol comprising the steps of:
   comparing a Huffman symbol bit pattern to a set of stored bit patterns in a content-addressable memory and retrieving a first bit pattern if the Huffman symbol bit pattern matches one of the set of stored bit patterns;
   comparing the Huffman symbol bit pattern to each base symbol bit pattern in a set of stored base symbol bit patterns comprising the steps of:
      subtracting the Huffman symbol bit pattern from each stored base symbol bit pattern to generate a set of offset values;
      selecting the offset value corresponding to the base symbol bit pattern matched to the Huffman symbol bit pattern length;
      adding the selected offset value to a base symbol value to generate an offset address, the base symbol value being uniquely assigned to the base symbol bit pattern which corresponds to the Huffman symbol bit pattern length; and
      retrieving a second bit pattern from a lookup table using the offset address;
   providing the first bit pattern from the content-addressable-memory at an output if the Huffman symbol bit pattern matches one of the set of stored bit patterns in the content-addressable memory; and
   providing the second bit pattern from the lookup table at an output if the Huffman symbol bit pattern does not match one of the set of stored bit patterns in the content-addressable memory.

4. The method of claim 3 wherein the set of stored bit patterns in the content-addressable memory are mapped to single coefficient Huffman symbols and the set of stored base symbol bit patterns are mapped to multiple coefficient Huffman symbols.

5. The method of claim 3 wherein selecting the offset value of the matched base symbol bit pattern further comprises the step of selecting the smallest zero or greater value from the set of offset values.

6. The method of claim 3 wherein the lookup table is stored in a random access memory.

7. The method of 3 wherein the content-addressable memory further comprises one or more additional sets of bit patterns, the Huffman symbol bit pattern being compared with the bit patterns of one of the sets of bit patterns in the content-addressable memory.

8. The method of claim 7 wherein each of the sets of bit patterns in the content-addressable memory represents a Huffman symbol table.

9. The method of claim 3 further comprising multiple sets of base symbol bit patterns, the Huffman symbol bit pattern being compared with the bit patterns of one of the more than one set of base symbol bit patterns.

10. The method of claim 9 wherein each of the more than one set of base symbol bit patterns represents a Huffman symbol table.

11. The method of claim 6 wherein the random access memory provides a JPEG symbol length and a zero run length for the matched bit pattern.

12. An apparatus for decoding a JPEG symbol comprising:
   a Huffman symbol register for receiving, storing and outputting a Huffman symbol;
   a content-addressable memory module for receiving the Huffman symbol and generating a symbol length and a magnitude length;
   a compare-add module for receiving the Huffman symbol and generating a symbol length and a magnitude length; and
   a symbol shifter for receiving the symbol length and additional JPEG symbols, and providing a subsequent symbol to the Huffman symbol register.

13. The apparatus of claim 12 wherein the content-addressable memory module compares the bit pattern of the Huffman symbol with a set of bit patterns to determine the symbol length and the magnitude length.

14. The apparatus of claim 12 wherein the compare-add module comprises:
   a comparator module for comparing a set of stored base symbol bit patterns with the Huffman symbol bit pattern and generating a lookup address;
   a lookup address register for storing the lookup address generated by the comparator module; and
   a random access memory storing a symbol length and a magnitude length for each of a set of addresses, the random access memory providing a symbol length and a magnitude length according to the address stored in the lookup address register.

15. An apparatus for decoding a JPEG symbol comprising:
   a Huffman symbol register for receiving, storing and outputting a Huffman symbol;
   a first content-addressable memory module for receiving the Huffman symbol and generating a symbol length and a magnitude length, the first content-addressable memory module comparing the Huffman symbol with a set of stored symbols representative of zero run length JPEG coefficients;
   a second content-addressable memory module for receiving the Huffman symbol and generating a symbol length and a magnitude length, the second content-addressable memory module comparing the Huffman symbol with a set of stored symbols representative of non-zero run length coefficients; and
   a symbol shifter for receiving the symbol length and additional JPEG symbols, and providing a subsequent symbol to the Huffman symbol register.

* * * * *